US007839238B2

(12) United States Patent
Le Nadan

(10) Patent No.: US 7,839,238 B2

(45) Date of Patent: Nov. 23, 2010

(54) COAXIAL ATTENUATOR

(75) Inventor: Thierry Le Nadan, St Etienne de Crossey (FR)

(73) Assignee: Radiall, Rosny Sous Bois (FR)

( * ) Notice: Subject to any disclaimer, the term of this patent is extended or adjusted under 35 U.S.C. 154(b) by 176 days.

(21) Appl. No.: 12/166,915

(22) Filed: Jul. 2, 2008

(65) Prior Publication Data

US 2009/0009272 A1 Jan. 8, 2009

(30) Foreign Application Priority Data

Jul. 3, 2007 (FR) .................................. 07 56246

(51) Int. Cl.
*H03H 7/00* (2006.01)

(52) U.S. Cl. .................... 333/185; 333/81 A; 333/22 R

(58) Field of Classification Search ............... 333/81 A, 333/81 R, 22 R, 185
See application file for complete search history.

(56) References Cited

U.S. PATENT DOCUMENTS

| | | | |
|---|---|---|---|
| 3,260,971 | A | 7/1966 | Helmut et al. |
| 4,011,531 | A | 3/1977 | Gaudet |
| 2004/1010478 | | 6/2004 | Shafer et al. |
| 2007/0013461 | A1 | 1/2007 | Montena |

*Primary Examiner*—Stephen E Jones
(74) *Attorney, Agent, or Firm*—Oliff & Berridge, PLC

(57) ABSTRACT

The present invention relates to a coaxial device comprising: a cartridge defined by a side wall including at least one electrically conductive region; and an electrical component fastened in the cartridge and including an electrical element connected to said electrically conductive region via at least one electrical connection; wherein said side wall is pierced by a through orifice giving direct access to the electrical connection.

15 Claims, 3 Drawing Sheets

Fig.3
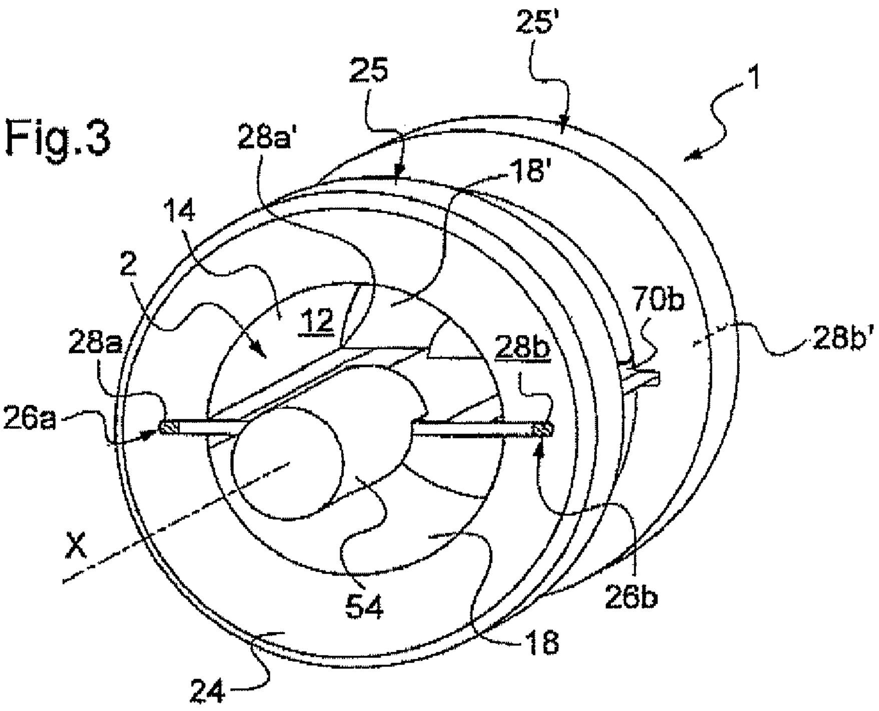
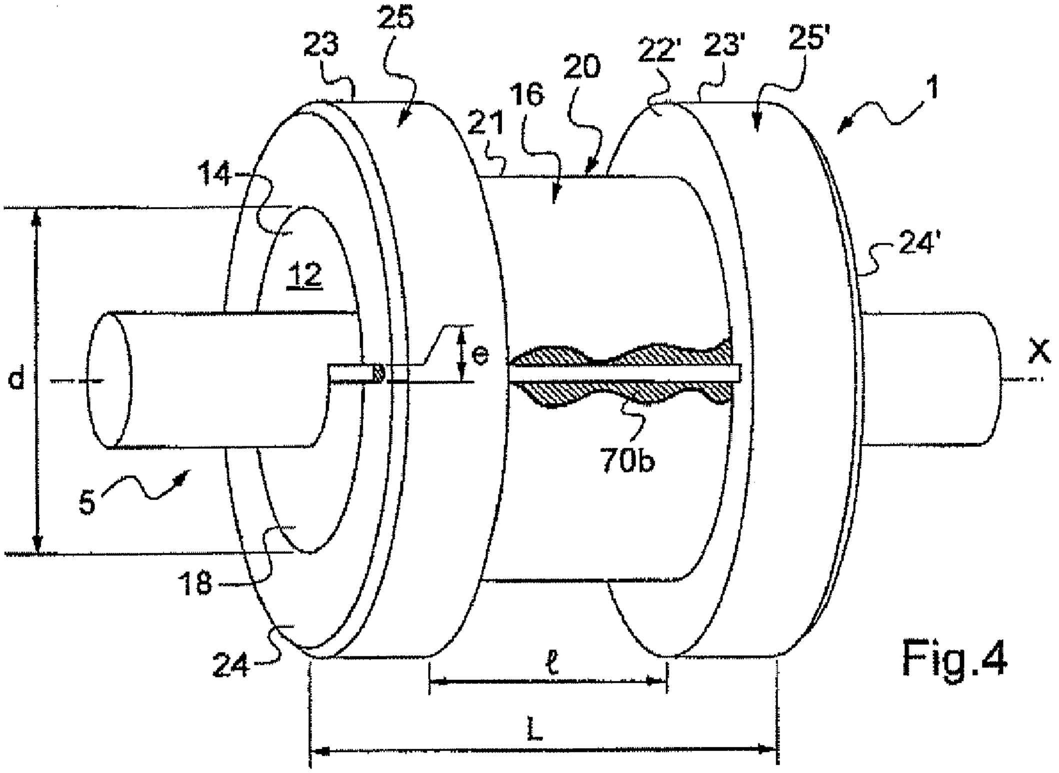
Fig.4

COAXIAL ATTENUATOR

The invention relates to a coaxial device, in particular for use in assembling components that operate at microwave frequencies, and in particular attenuators, and the invention also relates to a method of fabricating such a device.

BACKGROUND

As shown in FIG. 1, a coaxial technology attenuator conventionally comprises a cartridge 1 having held therein an electrical component 2, e.g. in the form of a printed circuit or strip. The cartridge 1 is generally substantially circularly cylindrical in shape, however it could equally well present some other shape, e.g. it could be of rectangular or oblong section. The electrical component 2 presents an axial central pin 3 and it is also in electrical contact with the cartridge 1 in order to establish a ground contact, the cartridge conventionally constituting the ground of the coaxial line.

The electrical component 2 comprises a substrate 4 in the form of a rectangular plate having two opposite edges received in diametrically opposite grooves formed in the inside surface of the cartridge. Along these edges, the electrical component has two ground contact strips 5*a* and 5*b*.

When the attenuator operates in low frequency bands, i.e. below 30 gigahertz (GHz), a localized ground contact suffices to ensure that the response of the attenuator in the frequency band under consideration is stable, and also that it is reproducible amongst different manufactured attenuators. In a first technology, as shown in FIG. 1, an electrical conductive corrugated piece 6 is thus interposed between the faces of the grooves, and the edges of the substrate 4 are inserted therein. The piece is shaped in such a manner as to be compressed so that a spring effect ensures electrical connection between the ground contact strips 5*a* and 5*b* and the cartridge.

Nevertheless, that technology provides a ground connection only at discrete points P. A lack of elasticity or deformation of the corrugated piece 6 on insertion can thus eliminate a contact point. In addition, from one attenuator to another, the corrugated piece 6 is not always placed in accurately identical manner relative to the printed circuit.

That technology can therefore not be used when very high frequency bands are intended. When attenuators operate at millimeter wavelengths, the quality of ground contacts becomes critical, and a lack of contact between an electrical component and the cartridge gives rise to deterioration at the top of the bands either in the matching or in the stability of the attenuation value, or else in both characteristics simultaneously. The most critical circumstances involve attenuators presenting high levels of attenuation, in particular levels greater than 10 decibels (dB), or attenuators that rely on a distributed architecture, i.e. having a plurality of resistive tiles. In both circumstances, any variation in the positioning of the current lines between the electrical component and the cartridge can degrade the performance of the attenuator. Finally, with very high frequencies, it becomes necessary to have recourse to substrates that are very fine, with a thickness of less than 127 micrometers (μm) in order to retain monomode operation. Unfortunately, fabricating corrugated pieces 6 that are adapted to said substrates is very difficult, if not impossible.

In a second technology (FIG. 2), the corrugated piece 6 is replaced by soldering 7. In the solder zones, electrical contact between the cartridge 1 and the ground contact strip 5*a* or 5*b* is very good quality. When the cartridge is long, e.g. because the electrical component presents distributed topology, it is nevertheless difficult to ensure uniform soldering over the entire length of the cartridge. Under such circumstances, there exist zones without contact between the ground contact strips and the cartridge, thereby leading to degraded performance.

There therefore exists a need for a coaxial device that does not present one or more of the above-mentioned drawbacks.

SUMMARY

An object of the invention is to satisfy this need.

According to the invention, this object is achieved by means of a coaxial device comprising:

a cartridge defined by a side wall including at least one electrically conductive region; and an electrical component fastened in the cartridge and including an electrical element connected to said electrically conductive region via at least one electrical connection.

According to the invention, said side wall is pierced by a through orifice giving direct access to the electrical connection.

An orifice is considered as "giving direct access" to the electrical connection when it enables "straight line" access to said connection from the outside surface of the cartridge. The orifice "pierces" the side wall when it extends through the entire thickness of said wall.

The provision of one or more access orifices of the invention at appropriate locations in the side wall of the cartridge makes it easier to access the electrical connection zone, in particular to establish or monitor said electrical connection, and this is particularly advantageous when it is necessary to guarantee very high quality contact between the electrical component and the cartridge.

The electrically conductive element of the electrical component is preferably received at least in part in said through orifice. More preferably, said conductive element projects to the outside of the cartridge beyond said through orifice. Still preferably, the through orifice is provided in the electrically conductive region of the side wall of the cartridge, the electrically conductive region defining at least part of the outside surface of the side wall of the cartridge.

All of these characteristics serve advantageously to further simplify establishing and monitoring the electrical connection between the electrically conductive region of the cartridge and the electrically conductive element of the electrical component.

In particular, the conductive element can then be welded or soldered to the electrically conductive region from the outside of the cartridge.

In an embodiment, the coaxial device of the invention includes soldering providing said electrical connection between the conductive region of the side wall of the cartridge and the conductive element of the electrical component.

To facilitate making the electrical connection, it is also preferable for the shape of the through orifice to be substantially complementary to the shape of the portion of the conductive element of the electrical component that is inserted therein. This conductive element is preferably in physical contact with more than 90%, and better substantially 100% of the length of the outside edge of the through orifice and/or with the side surface of said orifice.

In a preferred embodiment, the cartridge includes a groove formed in the inside surface of the cartridge and passing through the thickness of the side wall of the cartridge over at least a fraction of its length, in such a manner as to define said through orifice. Also preferably, the groove is substantially longitudinal and still preferably it extends substantially over the entire length of the cartridge.

Still preferably, the groove is shaped in such a manner as to allow the electrical component to be inserted in the cartridge by being slid in the groove.

Also preferably, the groove is shaped in such a manner as to guide the electrical component during said insertion.

In an embodiment of the invention, the conductive element passes through said through orifice and includes an electrically conductive strip that extends at least in part on the outside of the side wall of the cartridge. Preferably, the electrical component projects from the outside surface of said side wall by more than 0.08 mm, preferably more than 0.1 mm.

When the electrically conductive region of the cartridge extends at least in part around the through orifice, and is preferably in contact with the outside edge thereof, the contact strip can thus be connected easily, and in particular can be welded or soldered, to the electrically conductive region.

In particular, the contact strip may be fastened on a substrate, e.g. a flat substrate, that is held in position in a groove formed in the inside surface of the cartridge and defining a said through orifice, the substrate passing through said through orifice so as to expose to the outside at least a portion of the contact strip. Preferably, the width of the groove is substantially identical to the local thickness of the electrical substrate that is inserted therein.

However, still preferably, the difference between the width of the groove and the width of the electrical substrate is at least 0.01 mm, preferably at least 0.020 mm. Advantageously, solder applied outside the cartridge may therefore penetrate inside the cartridge though this opening. Said difference is preferably less than 0.05 mm, for a good centering of the electrical component in the cartridge. A difference of 0.025 mm is regarded as optimal.

The conductive element of the electrical component may also include a plurality of contact strips, in particular ground contact strips, extending over one or both main faces of the substrate.

The cartridge may present a plurality of grooves of the type described above, and preferably presents two such grooves, and the electrical component may be shaped to be inserted in said grooves. Increasing the number of grooves makes it advantageously possible to hold the electrical component effectively inside the cartridge.

The grooves are preferably distributed symmetrically about a longitudinal plane (i.e. a plane including the axis of the cartridge), thus advantageously making it possible to preserve symmetry for the electromagnetic field.

Likewise, the number of contact strips, preferably all of the same type, can be increased in order to increase the number of electrical connections with the cartridge.

The contact strips preferably extend along the outside edge of one or more through orifices, which are preferably formed by grooves of the type specified above.

All of the grooves are preferably substantially identical, and all of the contact strips are substantially identical and co-operate in similar manner with the corresponding grooves.

In particular, the cartridge may have first and second grooves, these grooves presenting one or more of the characteristics of the above-described groove. Preferably, the first and second grooves are longitudinal and lie in a common radial plane, i.e. a common plane containing the axis of the cartridge. The electrical component may comprise a substrate, in particular a substantially plane substrate, e.g. a rectangular substrate, with first and second longitudinal edges that are received in the first and second grooves respectively, at least the first and second contact strips extending on the substrate along the first and second longitudinal edges, respectively, and projecting to the outside through the orifices passing through the bottoms of said first and second grooves, respectively.

In particular, the substrate may carry a printed circuit, on one or both of its faces, and optionally its edge face may be metal plated.

The printed circuit may be:

of the hybrid type, i.e. it may include discrete components in addition to conductor patterns;

a thick layer circuit, i.e. it may present conductor and resistor patterns that are silkscreen-printed; or a thin layer circuit, i.e. it may present conductor patterns and resistor patterns that are obtained photolithograpically from conductive and resistive layers fabricated by evaporation in a vacuum.

The electrical component may be suitable for exerting any type of function. In particular, it may include attenuator means suitable for decreasing the amplitude of a periodic electrical signal over at least one range of frequencies of said signal.

In particular, the attenuator means may be capable of attenuating a signal at a frequency of less than 65 GHz, possibly a DC signal, and in particular a signal at a frequency lying in the range 20 GHz to 65 GHz, and in particular a signal greater than 30 GHz, or greater than 40 GHz, and preferably with attenuation that is greater than 10 dB.

The electrical component may also perform a function other than attenuation, for example it may perform peak-limiting.

The coaxial device of the invention can then advantageously be shaped in such a manner as to allow components to be assembled, and in particular components that operate at microwave frequencies, while using coaxial technology.

Conventionally, the electrical component includes an axial connection pin. The conductive element may be designed in particular to establish a ground contact, which contact may be established via the cartridge.

The cartridge is preferably made of an electrically conductive material, or it may be coated in a layer of such a material. It may be of arbitrary shape, in particular it may be cylindrical or oblong. In particular, the cartridge may present a hollow shape with a side wall of thickness that varies along its length, in particular in the vicinity of the groove(s). It is thus advantageously possible to adapt the depth of the or each groove so as to provide through orifices, while ensuring that the cartridge has appropriate stiffness.

In an embodiment, the cartridge is generally in the form of a sleeve, e.g. a cylindrical sleeve, and is provided at at least one, and preferably at both of its ends with at least one rim, preferably a substantially transverse rim, there being at least one preferably longitudinal groove provided in the inside surface of said sleeve, said groove presenting a depth that is appropriate for passing through the side wall of said sleeve, preferably over the entire length of the sleeve except under the rim(s).

The cartridge may be monobloc.

The groove may open out into one of the ends or "bases" of the cartridge, with the other end of the groove being closed by a wall that can act as an abutment for the electrical component. Preferably, the groove opens out into both of the bases of the cartridge.

The rim(s) may be disposed in a position other than at the ends of the sleeve. It may extend all around the sleeve, e.g. forming an annular bead, or it may occupy only a fraction of the periphery of the sleeve.

In order to ensure good mechanical cohesion for the cartridge, at least one rim, and preferably at least two rims, provide(s) bridges of material between the two sides of the groove. When the rim projects from the outside surface of the sleeve, it then covers the groove and prevents it from opening out to the outside through said surface.

In a variant, the depth of the groove may vary, the depth of the groove being less than the thickness of the side wall of the sleeve in order to establish a said bridge of material. The side wall of the cartridge, which is optionally of constant thickness along the groove, may thus present a shape that makes it possible, along the groove, to enable the groove to open out to the outside via one or more orifices, preferably of closed outline, preferably in the form of a single orifice that is preferably of closed outline. A closed outline corresponds to the presence of two bridges of material, one at each end of the orifice, thereby improving the mechanical cohesion of the cartridge. The groove nevertheless preferably does not open to the outside of the side wall over its entire length.

The device of the invention advantageously makes it easy to provide uniform soldering along the entire length of the orifices passing through the cartridge. It is then particularly suitable when the cartridge presents a length that is longer than 2 mm, or indeed longer than 4 mm. Generally, the length of the cartridge is less than 30 mm. The greatest transverse dimension of the cartridge is conventionally less than a diameter of 5 mm.

Means other than soldering can be used for providing electrical connection, in particular it is possible to use an electrically conductive adhesive, i.e. an adhesive that contains conductive particles in a quantity and of a shape that are such as to ensure, after polymerization, electrical conduction with low electrical resistance, typically resistivity of less than 0.01 ohm centimeter.

Preferably, the electrical connection between the cartridge and the conductive element of the electrical component occupies more than 90% of the length of the cartridge, or substantially the entire length of the cartridge, the connection being preferably uninterrupted, i.e. continuous.

In an embodiment, the device of the invention only comprises a cartridge, an electrical component and optionally an outside sheath. The sheath may be made of two cylinders covering the first and second ends of the cartridge, respectively, one end of the first cylinder being screwed on one end of the second cylinder. These two ends of the cylinders may, for instance, comprise an internal thread and a corresponding external thread, respectively, the end of the first cylinder being screwed o, the end of the second cylinder.

In an embodiment, the device of the invention does not comprise any means pressing on the electrical component, in particular pressing on a conductive element of the electrical component.

The invention also provides a method of fabricating a coaxial device comprising a cartridge defined by a side wall and an electrical component fastened in said cartridge, preferably a device of the invention. The method is remarkable in that an electrically conductive element of the electrical component, preferably passing through said side wall, is welded or soldered to the outside surface of the cartridge in an electrically conductive region of said cartridge.

Conventionally, the term "attenuator" is used to designate a device that serves to reduce the power of a signal. At one extreme, an attenuator serves to reduce the power to a value of zero. The attenuator is then said to be a "load".

The term "electrical component" includes not only a set of discrete elements interconnected by electrical connections, but also silkscreen-printed layers, e.g. resistive layers.

The term "soldering" is used to designate a bonding method that consists in interposing between the parts to be bonded together a metal or metal alloy that is suitable for melting. The term "solder" can also be used to mean the metal or the metal alloy itself.

A device is said to be "coaxial" if it has at each of its ends a single central pin that extends substantially along the axis of the device. A coaxial device conventionally includes an outer case or "cartridge" that is generally closed on itself.

BRIEF DESCRIPTION OF THE DRAWINGS

Other characteristics and advantages of the present invention appear further on reading the following description and on examining the accompanying drawings, in which:

FIGS. 3 and 4 are perspective views of a coaxial device of the invention;

In the various figures, identical references are used to designate members that are identical or analogous.

MORE DETAILED DESCRIPTION

Figure 1:
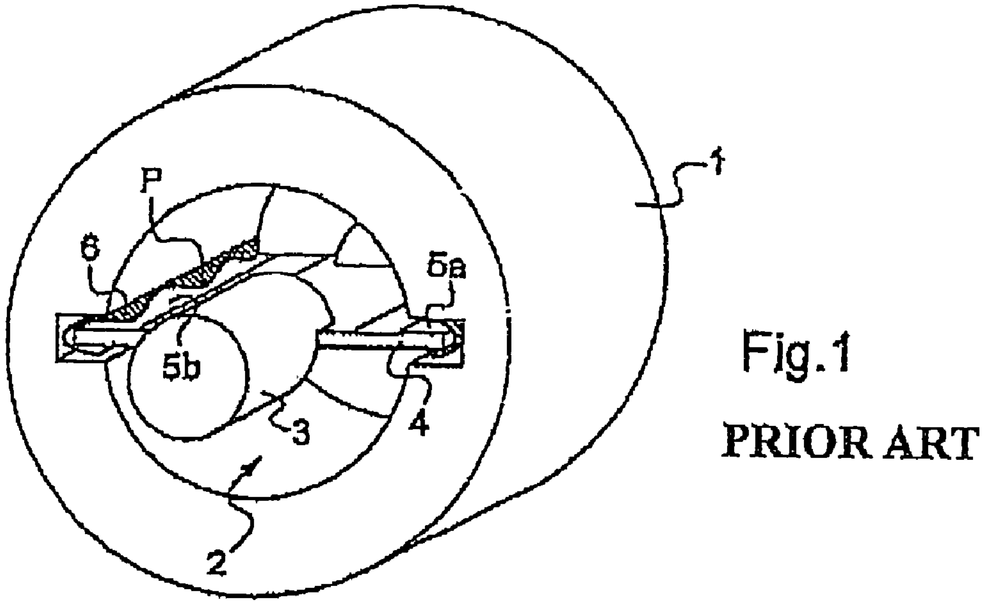
Fig.1 PRIOR ART
FIGS. 1 and 2 are perspective views showing coaxial devices of the prior art.
Figure 2:
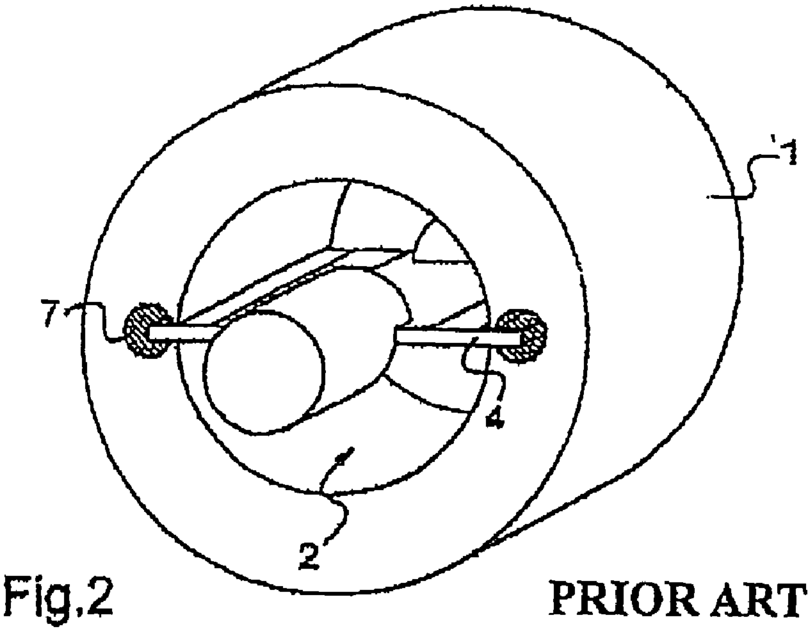
Fig.2 PRIOR ART
Figure 7:
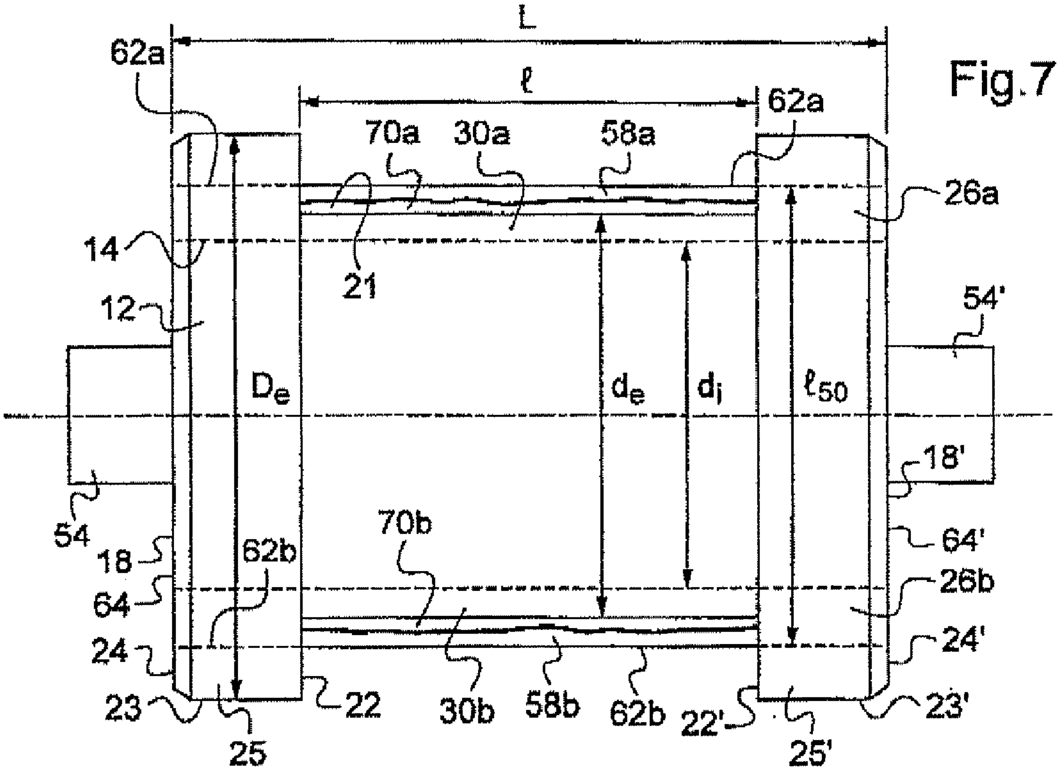
FIG. 7 is a side view of the coaxial device of FIGS. 3 and 4.

For reasons of clarity, the references are given a "prime" symbol when they relate to a member or a portion of a member that is located to the right of the figure and that corresponds to a member or a portion of a member having the same reference but that is located to the left of the figure. Similarly, the letters "a" and "b", when associated with a reference, serve to distinguish the item being referenced depending on whether it corresponds to the first groove or the second groove, respectively, FIGS. 1 and 2 are described in the introduction, so reference is made here to FIGS. 3, 4, and 7. The device shown comprises a cartridge 1 and an electrical component 2 that are shown in an assembled position.

The cartridge 1 is generally in the form of a sleeve that is a body of revolution about an axis X, defining an inside space 12 that is substantially cylindrical about the axis X, being defined by an inside surface 14 of a side wall 16 of the cartridge, and at the ends of the cartridge, by first and second base openings 18 and 18'.

On the outside, the cartridge is defined by an outside surface 20 presenting a central side surface 21 that is cylindrical about the axis X, and that is extended at each end by two transverse annular side surfaces 22 and 22', themselves being extended by end side surfaces 23 and 23' that are cylindrical about the axis X, and followed by transverse end surfaces 24 and 24', forming the bases of the cartridge 1.

The surfaces 22, 23, and 24 at one end, and 22', 23', and 24' at the other end, thus define respective transverse rims 25 and 25' forming annular regions of greater thickness than the side wall 16 of the cartridge.

First and second diametrically-opposite grooves respectively referenced **26*a* and 26*b* are formed lengthwise inside the cartridge in the inside surface 14 thereof. The grooves 26*a* and 26*b* of width "e" extend over the entire length "L" of the cartridge, and they open out into the bases of the cartridge via respective groove base openings 28*a* & 28*b* and 28*a*, & 28*b*'. The grooves 26*a* and 26*b*** are preferably substantially identical.

The rims 25 and 25' are of sufficient height to ensure that the grooves **26*a* and 26*b* do not open out sideways within the rims. The rims 25 and 25'** thus ensure physical integrity for the cartridge by holding together the two cartridge portions that extend on either side of the grooves.

The grooves 26*a* and 26*b* pass through the thickness of the side wall 16 over the length "l" between the rims 25 and 25'. The grooves 26*a* and 26*b* thus form respective orifices 30*a* and 30*b* that pass through the side wall 16 and that are of substantially rectangular section. The length "l" corresponds to the length of central side surface 21, such that the orifices 30*a* and 30*b* extend as far as the rims 25 and 25'.

In more general manner, according to the invention, the side wall 16 is pierced by a through orifice, which means that the orifice is open both to the inside surface 14 and to the side surface of the side wall 16, said side surface being formed by the central side surface 21, the transverse annular side surfaces 22 and 22', and the end side surfaces 23, and 23', but not including the transverse end surfaces 24 and 24'. In other words, said through orifice must pass through the entire thickness of the side wall 16. The through orifice is preferably oriented in a substantially radial direction.

The central side surface 21, at least in the vicinity of the orifices 30*a* and 30*b*, or else over the entire outside surface 20 of the cartridge 1, constitutes an electrically conductive region. Preferably, the entire cartridge 1 is made of an electrically conductive material.

Figure 5:
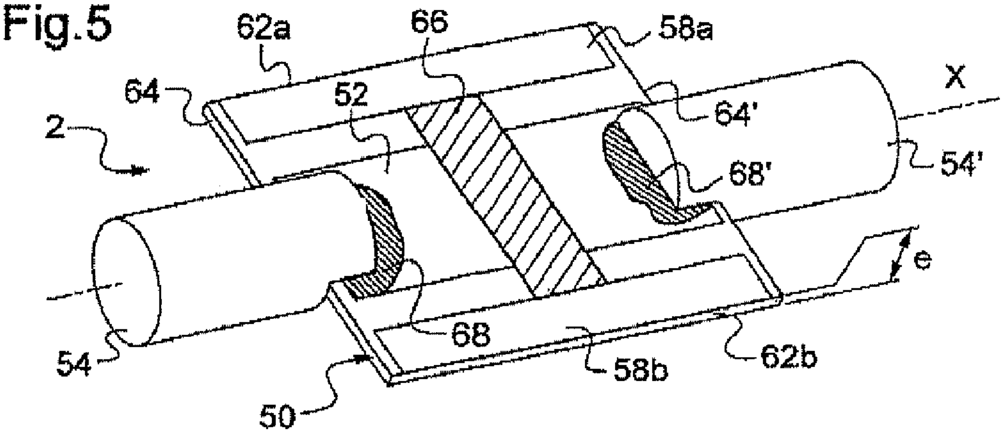
FIGS. 5 and 6 show electrical components suitable for being implemented in a coaxial device of the invention.

The electrical component 2 shown in detail in FIG. 5 comprises a substantially rectangular plane substrate 50. The substrate carries a printed circuit 52 that is electrically connected to two coaxial pins 54 and 54' on the axis X for central axial connection with other electrical components, and to an electrically conductive element that is for connection to ground. This conductive element comprises two ground strips 58*a* and 58*b* extending along respective longitudinal edges 62*a* and 62*b* of the substrate 50. The pins 54 and 54' for coming into internal electrical contact are bonded to the printed circuit 52 via respective lines of solder 68 and 68'.

Figure 6:
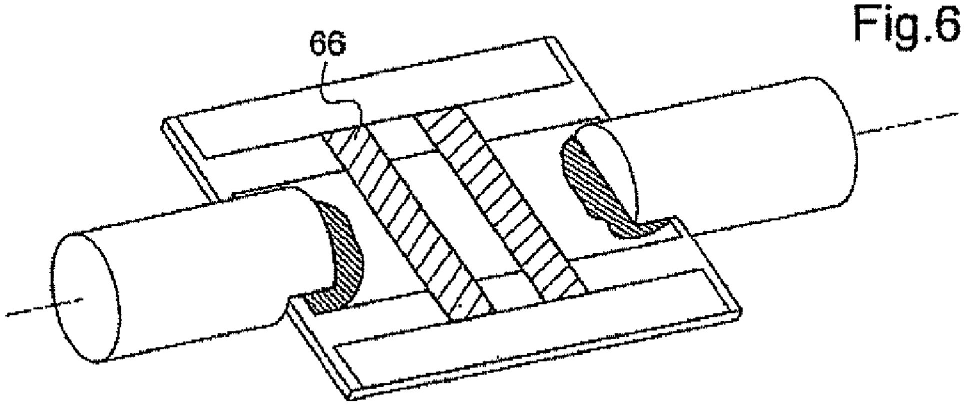

The contact strips 58*a* and 58*b* are connected to each other and to components of the printed circuit 52 by one (FIG. 5) or two (FIG. 6) or more transverse strips 66 suitable for carrying electronic components.

As shown in FIG. 3, the electrical component 2 is shaped in such a manner as to be suitable for being placed inside the cartridge 1, the pins 54 and 54' passing through respective base openings 18 and 18'. The length of the longitudinal edges 62*a* and 62*b* of the substrate 50 is preferably substantially equal to the length L of the cartridge 1. The electrical component 2 can thus be placed in the inside space 12 with the transverse edges 64 and 64' of the substrate being flush with the faces of the cartridge. In addition, the thickness of the substrate is substantially equal to the width "e" of the grooves. This ensures that the electrical component 2 is held optimally.

The length $l_{50}$ of the transverse edges 64 and 64' of the substrate 50 is longer than the inside diameter $d_i$ of the cartridge, shorter than the outside diameter $D_e$ of the cartridge at the rims 25 and 25', and shorter than (preferably substantially equal to) the distance between the bottoms of the grooves 26*a* and 26*b* where they pass through the rims 25 and 25'. The substrate 50 can thus be inserted into the cartridge 1 by the longitudinal edges 62*a* and 62*b* sliding in guided manner in the grooves 26*a* and 26*b*, respectively.

The length $l_{50}$ of the transverse edges 64 and 64' is longer than the outside diameter $d_e$ of the cartridge 1 in the central side portion 21. The longitudinal edges 62*a* and 62*b* can thus project from the central side surface 21, exposing to the outside at least a portion of each contact strip 58*a* and 58*b*.

Lines of solder 70*a* and 70*b* along the outside longitudinal edges of the orifices 30*a* and 30*b* respectively serve to establish electrical connection between each contact strip 58*a* and 58*b* and the central side surface 21.

The lines of solder 70*a* and 70*b* extend over the entire length of the longitudinal edges of the orifices 30*a* and 30*b*, but can also extend beneath the rims 25 and 25'.

The device shown in FIGS. 3 and 4 is particularly simple to assemble. The electrical component 2 is slid into the inside of the cartridge 1 by causing its longitudinal edges 62*a* and 62*b* to slide in the grooves 26*a* and 26*b* until the transverse edges 64 and 64' are flush with the bases of the cartridge. The contact strips 58*a* and 58*b* then project via the through orifices 30*a* and 30*b* beyond the central side surface 21 of the outside surface 20 of the cartridge 1. Soldering is then performed from the outside of the cartridge 1 in such a manner as to ensure that the conductive central side surface is electrically connected to the projecting contact strip of the electrical component 2. This soldering can be associated with soldering performed from the base openings 28*a*, 28*b*, 28*a'*, and 28*b'* of the grooves, using the prior art technique described in the introduction. The soldering preferably serves to establish an electrical connection between the cartridge 1 and the contact strips 58*a* and 58*b* over substantially the entire length thereof.

If the contact strips are present on both faces of the substrate 50, or indeed on the longitudinal edge faces thereof, the soldering can be performed, as shown in FIG. 4, on both sides of the substrate 50.

As can already be seen clearly, the invention makes it possible to simplify soldering operations considerably and thus to simplify fabrication of the coaxial device. In particular, it enables continuous soldering to be performed over substantially the entire length of the contact strips of the electrical component inserted in the cartridge.

In addition, applying solder to the outside surface of the cartridge enables quality of the soldering to be inspected visually in particularly easy manner.

Naturally, the present invention is not limited to the embodiments described and shown, that are given by way of non-limiting illustration.

In particular, the cartridge and the electrical component could be different from those described. The contact strips could also present a variety of shapes.

Except where mentioned to the contrary in the description, the term "comprising all should be understood as meaning comprising at least one".

Although the present invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A coaxial device comprising:

a cartridge defined by a side wall having at least one electrically conductive region; and an electrical component fastened in the cartridge and having an electrical element that is connected to said electrically conductive region via at least one electrical connection, said electrical connection being provided by soldering or by an electrically conductive adhesive;

wherein said side wall is pierced by a through orifice extending through the entire thickness of said side wall and providing direct access to the electrical connection.

2. A device according to claim 1, in which the cartridge includes first and second longitudinal grooves lying in a common radial plane, the electrical component comprising a substrate with first and second longitudinal edges that are received in said first and second grooves, respectively, at least the first and second contact strips extending on the substrate along the first and second longitudinal edges respectively and projecting to the outside via the orifices passing through the bottoms of said first and second grooves respectively.

3. A device according to claim 1, in which the electrical connection between the cartridge and the conductive element of the electrical component extends over substantially the entire length of the cartridge.

4. A device according to claim 1, the cartridge presenting a length greater than 2 mm.

5. A device according to claim 1, in which the electrically conductive element is housed, at least in part, in said through orifice.

6. A device according to claim 5, in which the electrically conductive element projects to the outside of the cartridge beyond said through orifice.

7. A device according to claim 6, in which said orifice is provided in the electrically conductive region of the side wall of the cartridge, the electrically conductive region defining at least part of the outside surface of the side wall.

8. A device according to claim 1, in which the cartridge includes a groove formed in the inside surface of said cartridge and passing through the thickness of the side wall of the cartridge over at least a fraction of its length in such a manner as to define said through orifice.

9. A device according to claim 8, the groove being shaped in such a manner as to allow the electrical component to be inserted into the cartridge by sliding in the groove.

10. A device according to claim 1, in which the conductive element passes through said through orifice and includes an electrically conductive contact strip that extends at least in part outside the side wall of the cartridge.

11. A device according to claim 10, in which the contact strip is fastened to a substrate that is held in position in a groove formed in the inside surface of the cartridge and defining a said through orifice, the substrate passing through said through orifice in such a manner as to expose at least a portion of the contact strip to the outside.

12. A device according to claim 1, in which the electrical component includes attenuator means suitable for diminishing the amplitude of a periodic electrical signal over at least one frequency range of said signal.

13. A device according to claim 12, said attenuation means being capable of attenuating a signal at a frequency greater than 20 GHz with attenuation greater than 10 dB.

14. A method of fabricating a coaxial device comprising a cartridge defined by a side wall and an electrical component fastened in said cartridge, wherein an electrically conductive element of the electrical component passes through said side wall and is welded or soldered to the outside surface of the cartridge in an electrically conductive region of said cartridge.

15. A method according to claim 14, wherein the coaxial device comprises:

a cartridge defined by a side wall having at least one electrically conductive region; and an electrical component fastened in the cartridge and having an electrical element that is connected to said electrically conductive region via at least one electrical connection, said electrical connection being provided by soldering or by an electrically conductive adhesive;

wherein said side wall is pierced by a through orifice extending through the entire thickness of said side wall and providing direct access to the electrical connection.

* * * * *